United States Patent
Chen et al.

(10) Patent No.: US 10,986,751 B1
(45) Date of Patent: Apr. 20, 2021

(54) EXTERNAL AIR BAFFLE NOZZLE

(71) Applicant: QUANTA COMPUTER INC., Taoyuan (TW)

(72) Inventors: Yi-Chieh Chen, Taoyuan (TW); Jen-Mao Chen, Taoyuan (TW); Wei-Te Wang, Taoyuan (TW); Shuo-Ting Jian, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/773,007

(22) Filed: Jan. 27, 2020

(51) Int. Cl.
*H05K 7/20* (2006.01)

(52) U.S. Cl.
CPC ..... *H05K 7/20145* (2013.01); *H05K 7/20172* (2013.01); *H05K 7/20727* (2013.01)

(58) Field of Classification Search
CPC .......... H05K 7/20145; H05K 7/20172; H05K 7/20727
See application file for complete search history.

(56) References Cited

U.S. PATENT DOCUMENTS

| | | | | |
|---|---|---|---|---|
| 5,456,632 | A * | 10/1995 | Ohtsu | H05K 7/20136 361/695 |
| 5,810,072 | A * | 9/1998 | Rees | H01L 23/467 165/121 |
| 6,654,244 | B2 * | 11/2003 | Laufer | H05K 7/20145 165/80.3 |
| 7,204,750 | B2 * | 4/2007 | Shen | G06F 1/20 165/80.3 |
| 7,609,517 | B2 * | 10/2009 | Sun | H05K 7/20727 361/690 |
| 8,743,537 | B2 * | 6/2014 | Yang | G06F 1/186 361/679.46 |
| 2009/0027852 | A1 * | 1/2009 | Roesner | H05K 7/20136 361/690 |
| 2018/0321716 | A1 * | 11/2018 | Lien | G06F 1/20 |

* cited by examiner

*Primary Examiner* — Robert J Hoffberg
(74) *Attorney, Agent, or Firm* — Nixon Peabody LLP

(57) ABSTRACT

An external air baffle nozzle has a top surface, a bottom surface, and a pair of sidewalls separating the top surface from the bottom surface. An end of the pair of sidewalls, an end of the top surface and an end of the bottom surface define an inlet. An opposite end of the pair of sidewalls, an opposite end of the top surface, and an opposite end of the bottom surface define an outlet. The outlet has a smaller cross section than a cross section of the inlet.

20 Claims, 4 Drawing Sheets

EXTERNAL AIR BAFFLE NOZZLE

TECHNICAL FIELD

The present disclosure relates generally to an external air baffle nozzle. More particularly, aspects of this disclosure relate to an external air baffle nozzle suitable for efficiently directing air flow at an inlet of an electronic component.

BACKGROUND

Distributed network systems have been widely adopted with the emergence of the cloud for computing applications. Network systems encompass numerous connected devices including servers, switches, and other devices that exchange data. Faster and denser electronic components have been used in network devices to address the need for increased data capability and speed.

Network devices such as servers generate an enormous amount of heat due to the operation of the internal electronic devices such as transceivers, controllers, processors, and memory. Overheating from the inefficient removal of such heat has the potential to shut down or impede the operation of such devices. Thus, network system devices, such as servers, are designed to rely on air flow through the interior of the system device to carry away heat generated from electronic components. Air flow is often generated by a fan system that accelerates air flow through the system device. The generated air flow thus carries collected heat away from the network system devices and out of the device. The generated air flow is most efficiently utilized if it is largely focused toward the network system devices and not dissipated throughout the rest of the system device.

Thus, there is a great need for providing a device and method that solves the above and other problems, including, for example, an air baffle nozzle that improves air flow for an electronic component.

SUMMARY

According to one implementation of the present disclosure, an air baffle nozzle includes a top surface, a bottom surface, and a pair of sidewalls separating the top surface from the bottom surface. The air baffle nozzle further has an end of the pair of sidewalls, an end of the top surface, and an end of the bottom surface that together, define an inlet. The air baffle nozzle also has an opposite end of the pair of sidewalls, an opposite end of the top surface, and an opposite end of the bottom surface that together define an outlet. The outlet has a smaller cross section than a cross section of the inlet.

In some other implementations of the present disclosure, the air baffle nozzle is configurable such that the cross section of the inlet is modifiable. The air baffle nozzle is configurable such that the cross section of the outlet is modifiable. The outlet of the air baffle nozzle is positioned adjacent to an inlet of an electronic component. In some other implementations, the electronic component includes a Graphics Processing Unit (GPU) or a field programmable gate array (FPGA) card. Furthermore, according to some other implementations, the cross section area of the outlet matches the cross section of the electronic component.

In some other implementations, the cross section of the inlet is larger than the cross section of the outlet, and enables a larger concentration of air flow to hotspots associated with the electronic component. The inlet is configured to receive air flow drawn in by a cooling device that is adjacent to the outlet. The top surface is angularly declined such that the cross section of the outlet is smaller than the cross section of the inlet. Furthermore, the bottom surface is angularly inclined such that the cross section of the outlet is smaller than the cross section of the inlet.

In accordance with other implementations of the present disclosure, an electronic device includes a chassis having an inlet and an outlet, an electronic component mounted within the chassis, a fan mounted in the chassis, and an air baffle nozzle coupled external to the chassis. The air baffle nozzle includes a top surface, a bottom surface, and a pair of sidewalls separating the top surface and the bottom surface. The air baffle nozzle also includes an end of the pair of sidewalls, an end of the top surface, and an end of the bottom surface that define an inlet. The air baffle nozzle further includes an opposite end of the pair of sidewalls, an opposite end of the top surface, and an opposite end of the bottom surface that define an outlet. The outlet has a smaller cross section than a cross section of the inlet.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

Figure 1:
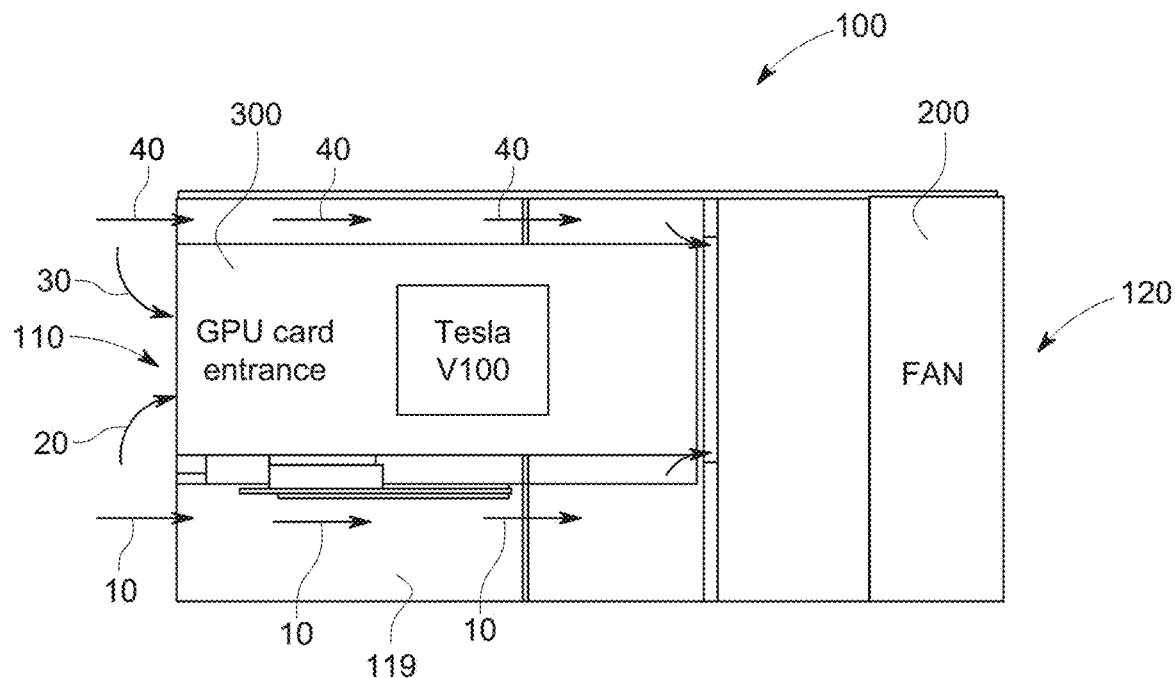
FIG. 1 is a top view of a network device, as known in the prior art.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

FIG. 1 is a top view of a network device 100, as known in the prior art. The network device 100 illustrated herein includes a cooling device 200, a chassis 119, and an electronic component 300. The network device 100 is illustrated in a simple configuration, and it is understood that the network device 100 includes multiple cooling devices 200 and electronic components 300. According to some examples, the cooling device 200 includes or is a fan configured to draw in unenhanced air flows 10, 20, 30, and 40, which include unenhanced side air flows 10, 40 and unenhanced central air flows 20, 30. The network device 100 is positioned between a cool aisle 110 and a hot aisle 120. The unenhanced air flows 10, 20, 30, and 40 are drawn in from the cool aisle 110, to pass over the electronic component 300, into the cooling device 200 (e.g., a fan), and exhausted out to the hot aisle 120.

Figure 2:
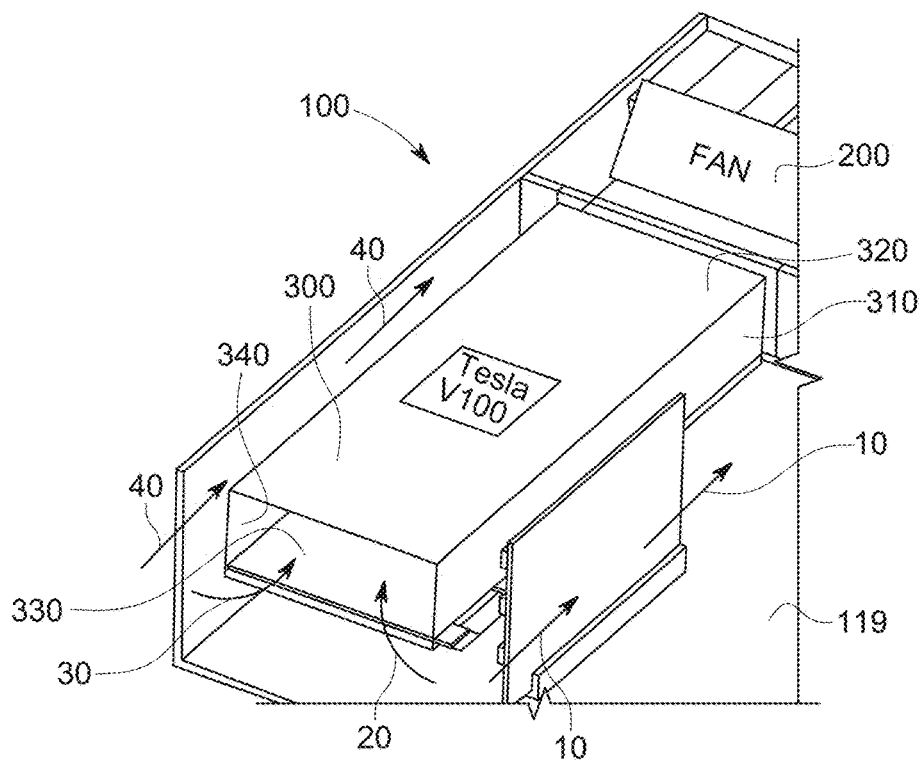
FIG. 2 is a perspective view of the network device of FIG. 1 illustrating air flow, as known in the prior art.

FIG. 2 is a perspective view of the network device 100 of FIG. 1 further illustrating the unenhanced air flow 10, 20, 30, and 40. The electronic component 300 includes an inlet 330, a first side 310, a top surface 320, and a second side 340. The unenhanced central air flows 20 and 30 pass through the inlet 330 of the electronic component to provide convection cooling to inner components of the electronic component 300. It is understood that the inlet 330 leads to a concentration of heat, and is recognized as a hotspot in the network device 100. In contrast, the unenhanced side air flows 10 and 40 pass by the electronic component 300, and provides virtually little to no convection cooling to the electronic component 300. The unenhanced side air flows 10 and 40 pass through what is recognized as non-hotspots. It should be understood that the electronic component 300 includes any server component devices, such as, for example, a graphics processing unit (GPU), field programmable gate array (FPGA) card, a peripheral component interconnect express (PCIe) card, or any other types of peripheral devices. As illustrated herein, the cooling configuration of the network device 100 is not efficient due to loss from the unenhanced side air flows 10 and 40 away from the hotspot.

Figure 3:
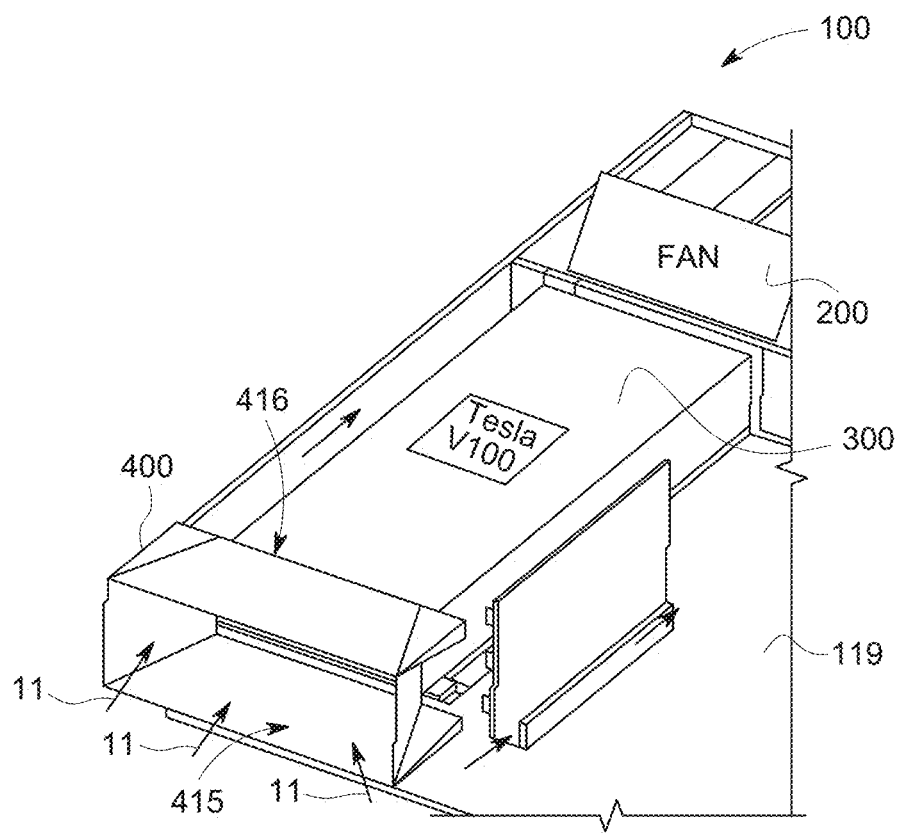
FIG. 3 is a perspective view of an example network device incorporating an external air baffle nozzle, in accordance with an embodiment of the disclosure.

FIG. 3 is a perspective view of an example network device 100 incorporating an external air baffle nozzle 400, in accordance with an embodiment of the disclosure. The external air baffle nozzle 400 is temporarily attached or permanently fixed to the electronic component 300. For the purposes of this discussion, the electronic component 300 is a high-powered GPU device. The external air baffle nozzle 400 includes an inlet 415 and an outlet 416. The outlet 416 is configured such that it attaches to the inlet 330 (illustrated in FIG. 2) of the electronic component 300. The inlet 415 of the external air baffle nozzle 400 has a larger cross section than the outlet 416 of the external air baffle nozzle 400, thereby allowing for an enhanced air flow 11. This is in contrast to the unenhanced central air flows 20 and 30 that are produced without the external air baffle nozzle 400 (which are illustrated in FIG. 2).

Figure 4:
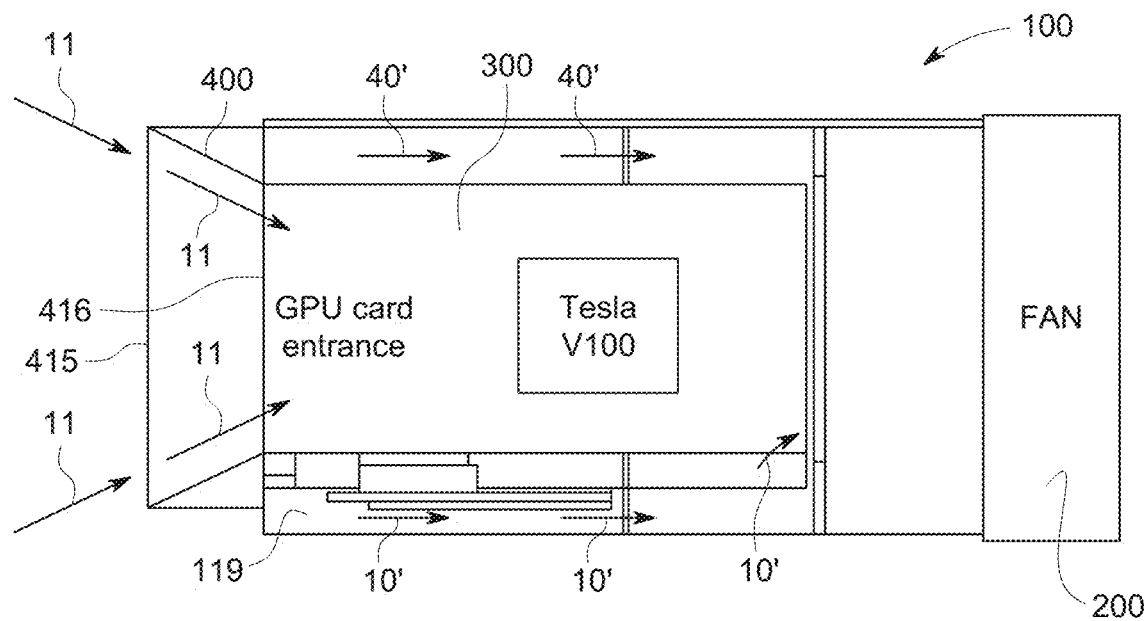
FIG. 4 is a top view of the network device of FIG. 3 illustrating air flow, in accordance with another embodiment of the disclosure.

FIG. 4 is a top view of the network device 100 of FIG. 3, which illustrates the enhanced air flow 11 and modified side air flows 40' and 10', in accordance with an embodiment of the disclosure. As illustrated, the large inlet 415 of the external air baffle nozzle 400 allows for the enhanced air flow 11 to pass through. The enhanced air flow 11 is concentrated to the hotspot of the electronic component 300 to improve the cooling efficiency of the network device 100. The modified side air flows 40' and 10' are minimized as a result of the large inlet 415, resulting in less air flow loss.

According to one example, a server has an electronic component 300 in the form of a high-powered GPU that, without the external air baffle nozzle 400, has a maximum air flow of about 42 cubic feet per minute (CFM) and supports a high operation temperature of about 35° Celsius. When the external air baffle nozzle 400 is added to the server, the GPU receives an additional 4 CFM enhanced air flow that allows the server to support an operational temperature of up to about 40° Celsius (i.e., resulting in a beneficial and advantageous operational temperature increase of about 5° Celsius).

Figure 5:
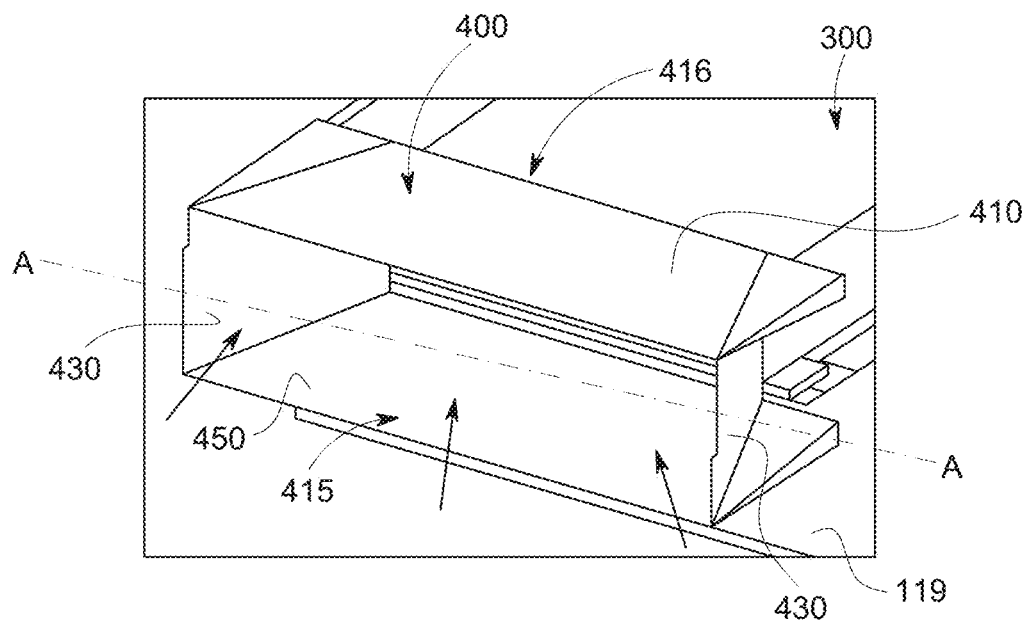
FIG. 5 is a perspective view of the external air baffle nozzle of FIG. 4 having an aerodynamic shape, in accordance with yet another embodiment of the disclosure.
Figure 6:
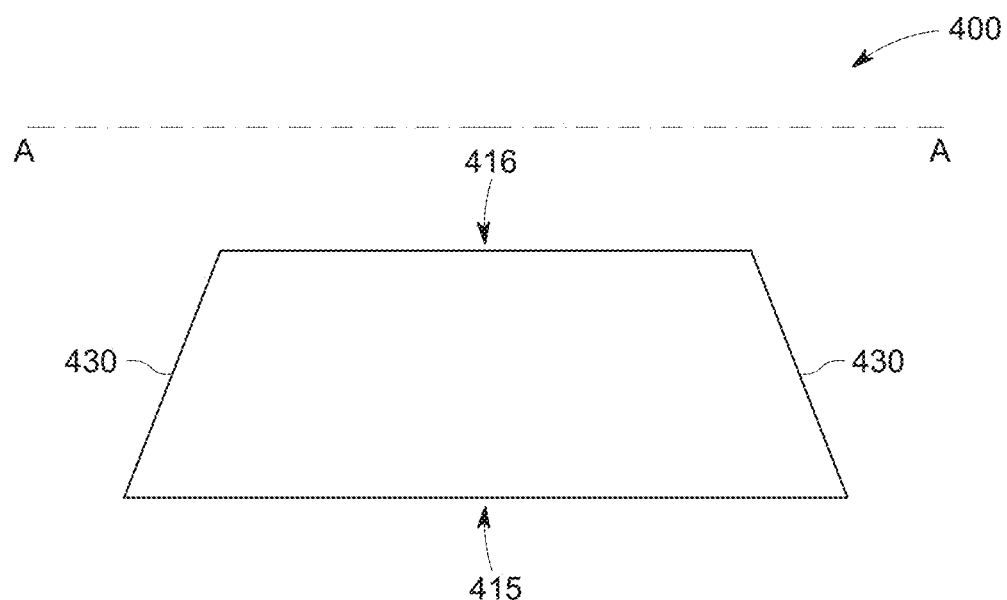
FIG. 6 is a cross-sectional view of the air baffle of FIG. 5, in accordance with yet another embodiment of the disclosure.

FIG. 5 is a perspective view of the external air baffle nozzle 400 having an aerodynamic shape, in accordance with an embodiment of the disclosure. FIG. 6 is a cross-sectional view of the external air baffle nozzle 400, in accordance with an embodiment of the disclosure.

The external air baffle nozzle 400 includes a top surface 410, a bottom surface 450, an inlet 415, an outlet 416, and sidewalls 430. The top surface 410 is declined at an angle such that the cross section of the outlet 416 is smaller than the cross section of the inlet 415. Similarly, the bottom surface 450 is inclined at an angle such that the cross section of the outlet 416 is smaller than the cross section of the inlet 415. The sidewalls 430 include mating pieces (not shown) configured to connect to the electronic component 300. The configuration of the external air baffle nozzle 400 is modifiable to fit any size electronic component. For example, the external air baffle nozzle 400 is modifiable in the field to fit a specific electronic component 300 on demand. This is accomplished due to the flexible materials used to construct the external air baffle nozzle 400. In this way, the cross section of the inlet 415 is increased or decreased on demand, based on cooling specifics of the electronic component. Furthermore, the outlet 416 can be increased or decreased on demand, based on the size of the electronic component 300. It should be understood that the orientation of an electronic component within the network device 100 may require multiple external air baffle nozzles 400. As illustrated above, the external air baffle nozzle 400 are configured to be temporarily attached to the electronic device 300, or can be permanently fixed to the electronic device 300.

Due to the customizable feature of the disclosed external air baffle nozzle 400, the external air baffle nozzle 400 does not occupy as much space as traditional air baffles. Furthermore, the ability to easily remove the external air baffle nozzle 400 from the network device 100 provides a customizable cooling feature that was not previously known in the art.

Figure 7:
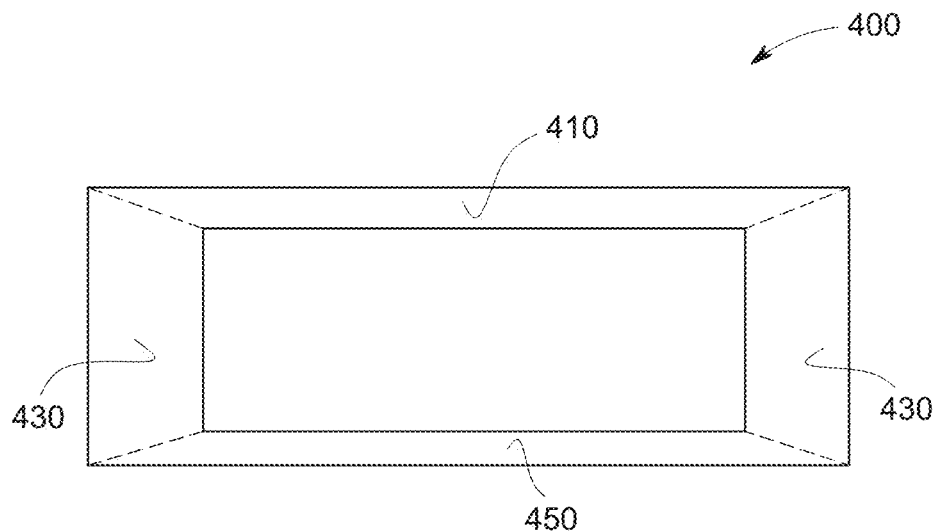
FIG. 7 is a perspective view of the external air baffle nozzle of FIG. 4 having an aerodynamic shape, in accordance with yet another embodiment of the disclosure.

FIG. 7 is a perspective view of the external air baffle nozzle 400 (illustrated in FIG. 4) having an aerodynamic shape, in accordance with an embodiment of the disclosure. In accordance with this illustration and the illustration of FIG. 5, the cross section of the inlet 415 is larger than the cross section of the outlet 416. This configuration enables a larger concentration of air flow to hotspots associated with the electronic component (of FIG. 3). The top surface 410 is angularly declined, the bottom surface 450 is angularly inclined, and the sidewalls 430 are tapered inward such that the cross section of the outlet is 416 smaller than the cross section of the inlet 415.

Figure 8:
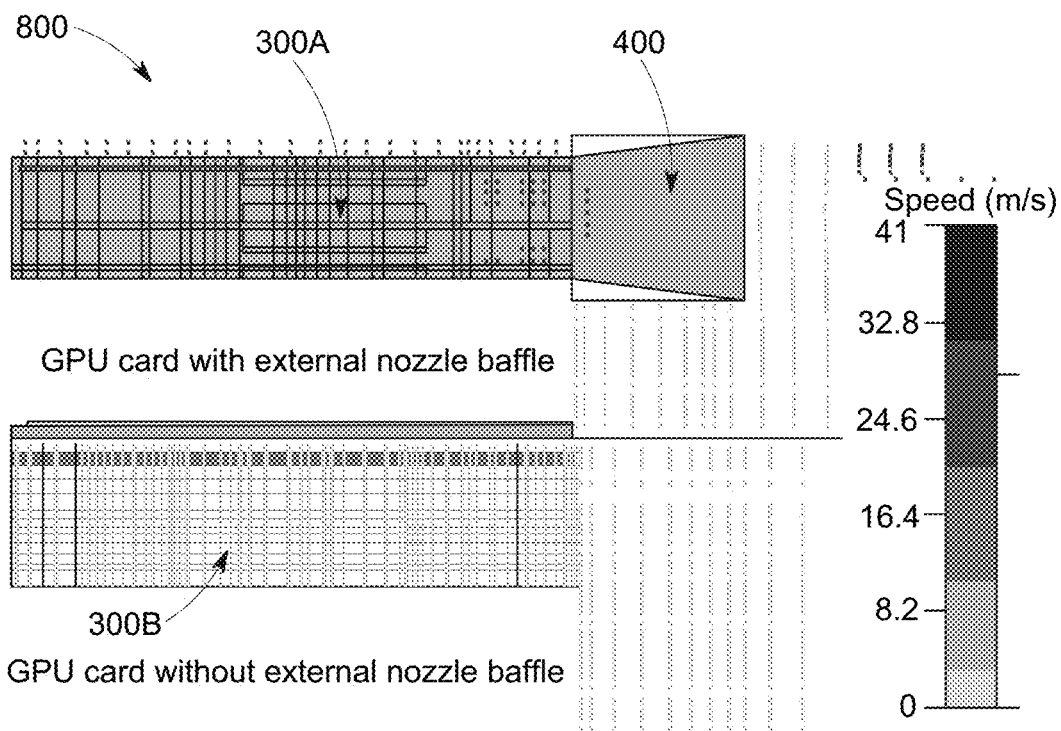
FIG. 8 is a graph illustrating velocity vectors of an electronic device with the external air baffle nozzle compared to the electronic device without the external air baffle nozzle, in accordance with yet another embodiment of the disclosure.

FIG. 8 is a graph illustrating velocity vectors across an electronic component 300A with the external air baffle nozzle 400, compared to an electronic component 300B without the external air baffle nozzle 400. As illustrated herein, the external air baffle nozzle 400 creates a greater concentration of velocity vectors directly at the electronic device 300A. The larger concentration of air flow increases the cooling efficiency of the system as a whole.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Computing devices typically include a variety of media, which can include computer-readable storage media and/or communications media, in which these two terms are used herein differently from one another as follows. Computer-readable storage media is any available storage media that can be accessed by the computer; is typically of a non-transitory nature; and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media that can be used to store desired information. Computer-readable storage media can be accessed by one or more local or remote computing devices, e.g., via access requests, queries or other data retrieval protocols, for a variety of operations with respect to the information stored by the medium.

The terminology used herein is for the purpose of describing particular embodiments only, and is not intended to be limiting of the invention. As used herein, the singular forms "a," "an" and "the" are intended to include the plural forms as well, unless the context clearly indicates otherwise. Furthermore, to the extent that the terms "including", "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An air baffle nozzle comprising:
   a top surface;
   a bottom surface; and
   a pair of sidewalls separating the top surface and the bottom surface,
   wherein an end of the pair of sidewalls, an end of the top surface, and an end of the bottom surface define a nozzle inlet,
   wherein an opposite end of the pair of sidewalls, an opposite end of the top surface, and an opposite end of the bottom surface define nozzle outlet, the nozzle outlet having a smaller cross section than a cross section of the nozzle inlet,
   wherein at least one of the pair of sidewalls, the top surface, and the bottom surface is shaped to provide an enhanced air flow through the nozzle outlet and a modified side air flow adjacent the nozzle outlet, and
   wherein the nozzle outlet of the air baffle nozzle is positioned adjacent to a component inlet of an electronic component within a chassis such that the enhanced air flow passes through the component inlet and the modified side air flow passes around the electronic component.

2. The air baffle nozzle of claim 1, wherein the air baffle nozzle is configurable such that the cross section of the nozzle inlet is modifiable.

3. The air baffle nozzle of claim 2, wherein the air baffle nozzle is configurable such that the cross section of the nozzle outlet is modifiable.

4. The air baffle nozzle of claim 1, wherein the electronic component includes a field programmable gate array (FPGA) card or a Graphics Processing Unit (GPU).

5. The air baffle nozzle of claim 1, wherein the cross section of the nozzle outlet matches a cross section of the component inlet of the electronic component.

6. The air baffle nozzle of claim 1, wherein the cross section of the nozzle inlet is larger than the cross section of the nozzle outlet and enables a larger concentration of the enhanced air flow to hotspots associated with the electronic component.

7. The air baffle nozzle of claim 1, wherein the nozzle inlet is configured to receive air drawn in by a cooling device.

8. The air baffle nozzle of claim 1, wherein the top surface is angularly declined such that the cross section of the nozzle outlet is smaller than the cross section of the nozzle inlet.

9. The air baffle nozzle of claim 1, wherein the bottom surface is angularly inclined such that the cross section of the nozzle outlet is smaller than the cross section of the nozzle inlet.

10. The air baffle nozzle of claim 1, wherein the top surface is angularly declined such that the cross section of the nozzle outlet is smaller than the cross section of the nozzle inlet, the bottom surface being angularly inclined such that the cross section of the nozzle outlet is smaller than the cross section of the nozzle inlet.

11. The air baffle nozzle of claim 1, wherein the at least one of the pair of sidewalls, the top surface, or the bottom surface that is shaped to provide the enhanced air flow through the nozzle outlet and the modified side air flow adjacent the nozzle outlet has a uniform thickness.

12. An electronic device, comprising:
a chassis having a chassis inlet and a chassis outlet;
an electronic component mounted within the chassis;
a fan mounted in the chassis; an air baffle nozzle coupled external to the chassis, the air baffle nozzle including:
a top surface;
a bottom surface; and
a pair of sidewalls separating the top surface and the bottom surface,
wherein an end of the pair of sidewalls, an end of the top surface, and an end of the bottom surface define a nozzle inlet,
wherein an opposite end of the pair of sidewalls, an opposite end of the top surface and an opposite end of the bottom surface define a nozzle outlet, the nozzle outlet having a smaller cross section than a cross section of the nozzle inlet,
wherein the air baffle nozzle is shaped to provide an enhanced air flow through the nozzle outlet and a modified side air flow adjacent the nozzle outlet, and
wherein the nozzle outlet is positioned adjacent to a component inlet of the electronic component such that the enhanced air flow passes through the component inlet and the modified side air flow passes around the electronic component.

13. The electronic device of claim 12, wherein the component inlet of the electronic component is adjacent to an edge of the chassis.

14. The electronic device of claim 12, wherein the air baffle nozzle is configurable such that the cross section of the nozzle inlet is modifiable.

15. The electronic device of claim 14, wherein the air baffle nozzle is configurable such that the cross section of the nozzle outlet is modifiable.

16. The electronic device of claim 12, wherein the electronic component includes a field programmable gate array (FPGA) card or a Graphics Processing Unit (GPU).

17. The electronic device of claim 12, wherein the cross section of the nozzle outlet matches a cross section of the component inlet of the electronic component.

18. The electronic device of claim 12, wherein the cross section of the nozzle inlet is larger than the cross section of the nozzle outlet and enables a larger concentration of the enhanced air flow to hotspots associated with the electronic component.

19. The electronic device of claim 12, wherein the top surface is declined such that the cross section of the nozzle outlet is smaller than the cross section of the nozzle inlet, the bottom surface being inclined such that the cross section of the nozzle outlet is smaller than the cross section of the nozzle inlet.

20. The electronic device of claim 12, wherein at least one of the pair of sidewalls, the top surface, or the bottom surface has a uniform thickness.

* * * * *